United States Patent
Ting et al.

(10) Patent No.: US 8,957,006 B2
(45) Date of Patent: Feb. 17, 2015

(54) CLEANING SOLUTION COMPRISING AN ETHER ACETATE FOR PREVENTING PATTERN COLLAPSE

(71) Applicant: Taiwan Semiconductor Manufacturing Company, Ltd., Hsin-Chu (TW)

(72) Inventors: Chih-Yuan Ting, Taipei (TW); Jeng-Shiou Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 13/794,304

(22) Filed: Mar. 11, 2013

(65) Prior Publication Data

US 2014/0256155 A1 Sep. 11, 2014

(51) Int. Cl.
  *C11D 3/395* (2006.01)
  *C11D 3/44* (2006.01)
  *G03F 7/42* (2006.01)
  *H01L 21/02* (2006.01)

(52) U.S. Cl.
  CPC .............. *G03F 7/423* (2013.01); *H01L 21/0206* (2013.01)
  USPC ........... 510/175; 510/176; 510/367; 510/372; 510/375; 510/432; 134/1.2; 134/1.3

(58) Field of Classification Search
  USPC .............. 510/175, 176, 367, 372, 375, 432; 134/1.2, 1.3
  See application file for complete search history.

(56) References Cited

U.S. PATENT DOCUMENTS

| | | | | |
|---|---|---|---|---|
| 5,891,392 | A * | 4/1999 | Monticello et al. | 422/28 |
| 6,010,994 | A * | 1/2000 | Choy et al. | 510/312 |
| 8,714,855 | B2 * | 5/2014 | Littig et al. | 401/133 |
| 2002/0082181 | A1 * | 6/2002 | Humphrey et al. | 510/305 |
| 2007/0087954 | A1 * | 4/2007 | Wang et al. | 510/302 |
| 2007/0218692 | A1 * | 9/2007 | Wolk et al. | 438/692 |
| 2008/0026583 | A1 * | 1/2008 | Hardy et al. | 438/693 |
| 2013/0196890 | A1 * | 8/2013 | Post | 510/363 |
| 2013/0219631 | A1 * | 8/2013 | Littig et al. | 8/137 |
| 2014/0011726 | A1 * | 1/2014 | Mitchell et al. | 510/391 |
| 2014/0113001 | A1 * | 4/2014 | Ramirez et al. | 424/616 |

* cited by examiner

*Primary Examiner* — Charles Boyer
(74) *Attorney, Agent, or Firm* — Haynes and Boone, LLP

(57) ABSTRACT

A chemical solution for use in cleaning a patterned substrate includes water, from approximate 0.01 to 99.98 percent by weight; hydrogen peroxide, from 0 to 30 percent by weight; a pH buffering agent, from approximate 0.01 to 50 percent by weight; a metal chelating agent, from approximate 0 to 10 percent by weight; and a compound for lowering a surface tension of the combination of water, hydrogen peroxide, pH buffering agent, and metal chelating agent. Examples of the compound include an organic solvent, from approximate 0 to 95 percent by weight, or a non-ionic surfactant agent, from approximate 0 to 2 percent by weight.

16 Claims, 5 Drawing Sheets

CLEANING SOLUTION COMPRISING AN ETHER ACETATE FOR PREVENTING PATTERN COLLAPSE

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

For example, as the critical dimension (CD) of feature is scaled down, the feature may have a relatively high aspect ratio (the ratio of the height vs. width of the feature). When this high aspect ratio reaches a critical value, the feature may actually collapse or fall down during the fabrication process. Accordingly, what is needed is a method for preventing this from happening.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 1:
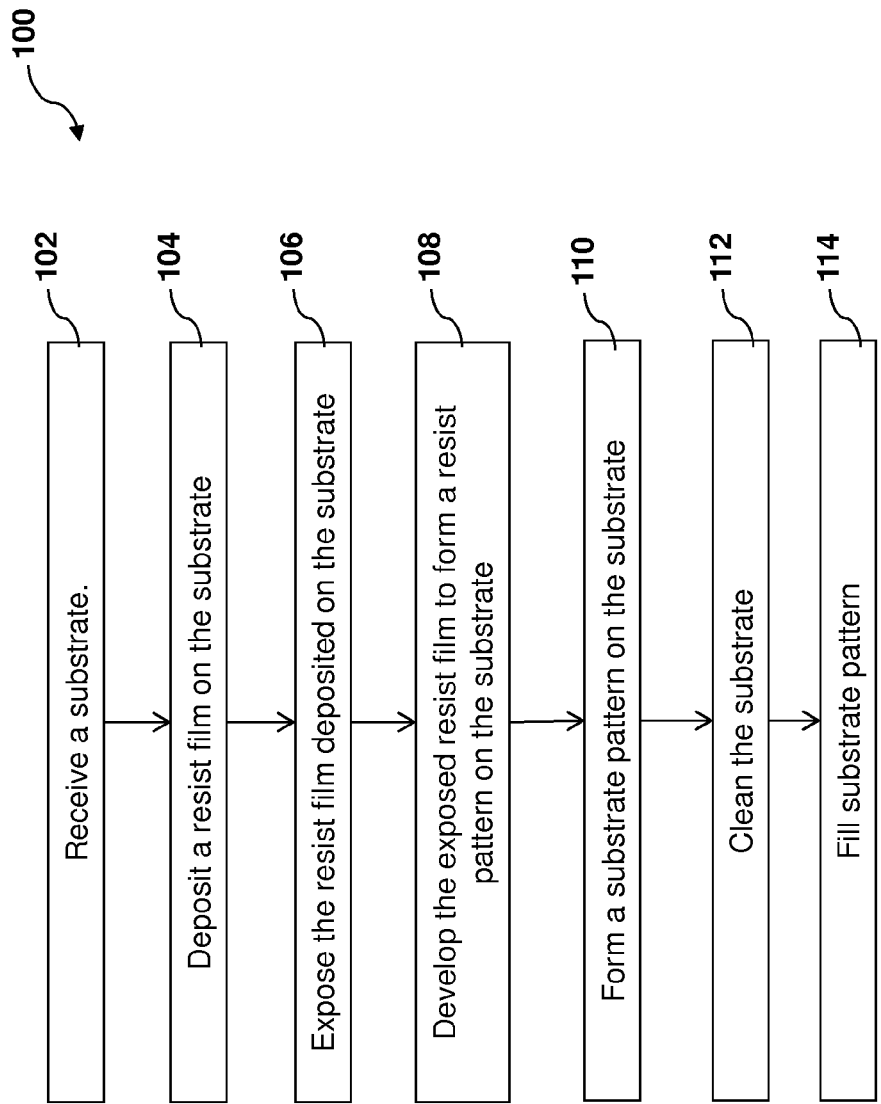
FIG. 1 is a flow chart of a method of fabricating a device for implementing one or more embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, a flow chart of a method 100 for fabricating a device is illustrated for benefitting from one or more embodiments. It is understood that additional steps can be provided before, during, and after the method 100, and some steps described can be replaced, eliminated, or moved around for additional embodiments of the method 100. The method 100 will be further described below, and more specific embodiments of forming a device 200 using the method 100 will concurrently be described with reference to FIGS. 2-6.

Figure 2:
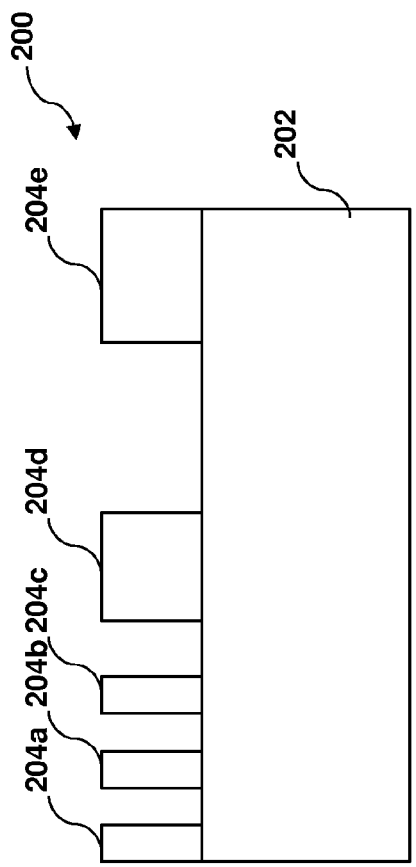
FIGS. 2-5 and 7 are cross sectional views of forming a device according to the method of FIG. 1.

The method 100 begins at step 102 by receiving or providing a substrate. In some embodiments, the substrate may include a wafer, such as a silicon wafer, for fabricating a device on the wafer. In some embodiments, the substrate may include a mask blanket for making a photomask. Referring to FIG. 2, a silicon substrate 202 is provided.

The method 100 proceeds to step 104 by depositing a resist film on the substrate. In the present embodiment, a resist is also referred to as a photo resist. A resist may include a positive resist or a negative resist. A resist film may include a single layer resist film or a multiple layer resist film. One way of depositing a resist film on the substrate includes using a coating process, for example, a spin-on process. Another way of depositing a resist film includes performing a dehydration process before applying the resist on the substrate, which can enhance an adhesion of the resist film to the wafer substrate. The dehydration process may include baking the substrate at a high temperature for a duration of time, or applying a chemical such as hexamethyldisilizane (HMDS) to the substrate. A different way may also include a soft bake (SB) process to drive a solvent out of a resist film and increase mechanical strength of a resist film. Another alternative way may include applying an antireflective coating, such as a bottom antireflective coating (BARC) or a top antireflective coating (TARC).

The method 100 proceeds to step 106 by exposing the resist film deposited on the substrate in a lithography system according to an IC design layout. In one embodiment, a lithography system includes an ultraviolet (UV) light, a deep ultraviolet (DUV) light, an extreme ultraviolet (EUV), or an X-ray light lithography system. In another embodiment, a lithography system includes a charged particle lithography system, such as an electron beam or an ion beam lithography system.

The method 100 proceeds to step 108 by applying a developer on the exposed resist film deposited on a substrate to form a resist pattern on the substrate. In one embodiment, a developer includes a water based developer, such as tetramethylammonium hydroxide (TMAH), for a positive tone development (PTD). In another embodiment, a developer may include an organic solvent or a mixture of organic solvents, such as methyl a-amyl ketone (MAK) or a mixture involving the MAK, for a negative tome development (NTD). Applying a developer includes spraying a developer on the exposed resist film, for example by a spin-on process. Applying a developer also include using a post exposure bake (PEB), a post develop bake (PDB) process, or a combination thereof. Referring again to FIG. 2, resist patterns 204a-e are formed on the substrate 202.

Figure 3:
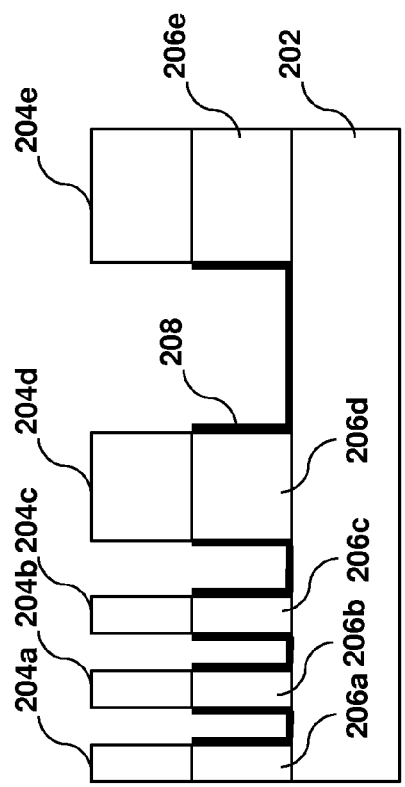

The method 100 proceeds to step 110 by etching, with the resist pattern formed on the substrate, to form a substrate pattern embedded into the substrate. In the present embodiments, a substrate pattern is also referred to as a substrate feature. The resist pattern defines dimension of the substrate pattern and protects the substrate underneath the resist. In some embodiments, the etching process may include a dry (plasma) etching, a wet etching, and/or other etching methods. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In other embodiments, a gas used in an etching process may react with a resist to form etching residues on sidewall or bottom of a substrate pattern. In some embodiments, the etching residues may include C, F, Cl, Br, or O. Referring to FIG. 3, substrate patterns 206a-e are formed in the substrate 202. It is noted that etching residue 208 is disposed around the substrate patterns 206a-e.

Figure 4:
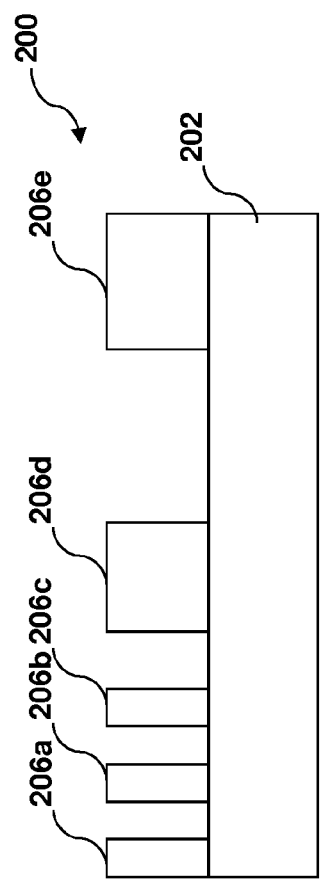

The method 100 proceeds to step 112 by cleaning the substrate with a chemical solution to remove the unconsumed resist disposed on top of the substrate pattern and the etching residues disposed on sidewall and bottom of the substrate pattern. Referring to FIG. 4, the substrate patterns 206a-e are formed in the substrate 202. The etching residue 208 and the resist patterns 204a-e are removed.

Figure 5:
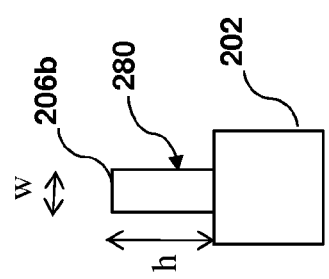

For the sake of further reference, FIG. 5 shows one of the patterns 206b of FIG. 4. The pattern 206b includes a pattern height h and a pattern width w. A ratio of h/w is defined as an aspect ratio of the pattern. There are several reasons why the pattern 206b may fall. For one, the pattern may exceed a "critical" aspect ratio. In other words, when an aspect ratio of a pattern is equal to or larger than its critical aspect ratio of the pattern, the pattern may collapse or fall down. Another reason is based on a pitch of a sidewall 280 of the substrate pattern 206b. The pattern illustrated in FIG. 5 has a near right-angle vertical pitch, but other pitches can exist, such as where the pattern 206b is wider at its bottom than at its top. It has been found that a greater pitch (wider at the bottom) often supports a higher critical aspect ratio. For example, a critical aspect ratio of a pattern is approximate at 4 when a pitch of the pattern is at 70 nm (change from width at the top of the feature, to width at the bottom of the feature), and a critical aspect ratio of a pattern is approximate at 3.5 when a pitch of the pattern is at 40 nm. Therefore, a pattern having a small pitch is prone to collapse.

Yet another reason that a feature may be more prone to fall or collapse is when the feature includes a relative soft or non-rigid, material, such as silicon dioxide, porous silicon dioxide, organic polymeric material, or silicon based polymeric material. In these cases, the patterns may be even more prone to collapse or fall down. For example, the substrate patterns 206a-e may collapse or fall down during the aforementioned cleaning process because of high surface tension of a chemical solution being used during the process. In one example, for a pattern having a pitch at 64 nm, a critical aspect ratio is about 3.8 in a chemical solution having a surface tension at about 70 mN/m and about 4.8 in a chemical solution having a surface tension at about 30. In another example, for a pattern having a pitch at 32 nm, a critical aspect ratio is about 3.2 in a chemical solution having a surface tension at about 70 mN/m and about 3.9 in a chemical solution having a surface tension at about 30. A critical aspect ratio of a pattern increases while disposed in a chemical solution having a low surface tension.

Based on foregoing discussion, in order to keep a high critical aspect ratio of a pattern and prevent the pattern collapse, a chemical solution having low surface tension can be used according to one or more embodiments. For example, a critical aspect ratio for a pattern having a pitch at 64 is about 3.8 in a chemical solution having surface tension at about 70 mN/m, such as in a water based chemical solution, and a pattern having an aspect ratio (e.g. 4.2) larger than the critical aspect ratio (e.g. 3.8) may collapse or fall in the water based chemical solution; and a critical aspect ratio for a pattern having a pitch at 64 is about 4.8 in a chemical solution having surface tension at about 30 mN/m, such as in an organic solvent based chemical solution, and the same pattern having an aspect ratio (e.g. 4.2) smaller than the critical aspect ratio (e.g. 4.8) may stand well in the organic solvent based chemical solution.

In another example, a critical aspect ratio for a pattern having a pitch at 32 is about 3.2 in a chemical solution having surface tension at about 70 mN/m, such as in a water based chemical solution, and a pattern having an aspect ratio (e.g. 4.0) larger than the critical aspect ratio (e.g. 3.2) may collapse or fall in the water based chemical solution; and a critical aspect ratio for a pattern having a pitch at 32 is about 4.3 in a chemical solution having surface tension at about 23 mN/m, such as in an organic solvent based chemical solution, and the same pattern having an aspect ratio (e.g. 4.0) smaller than the critical aspect ratio (e.g. 4.3) may stand well in the organic solvent based chemical solution.

Therefore, in some embodiments, a chemical solution having low surface tension is used to prevent a pattern with a high aspect ratio (e.g. 4) from collapsing or falling. In one embodiment, a pattern having a pitch at 64 nm with an aspect ratio lower than 4 may stand well in a chemical solution having a surface tension lower than about 63 mN/m. In another embodiment, a pattern having a pitch at 46 nm with an aspect ratio lower than 4 may stand well in a chemical solution having a surface tension lower than about 42 mN/m. In an alternative embodiment, a pattern having a pitch at 32 nm with an aspect ratio lower than 4 may stand well in a chemical solution having a surface tension lower than about 28 mN/m. In yet another alternative embodiment, a pattern having a pitch at 20 nm with an aspect ratio lower than 4 may stand well in a chemical solution having a surface tension lower than about 22 mN/m.

Figure 6:
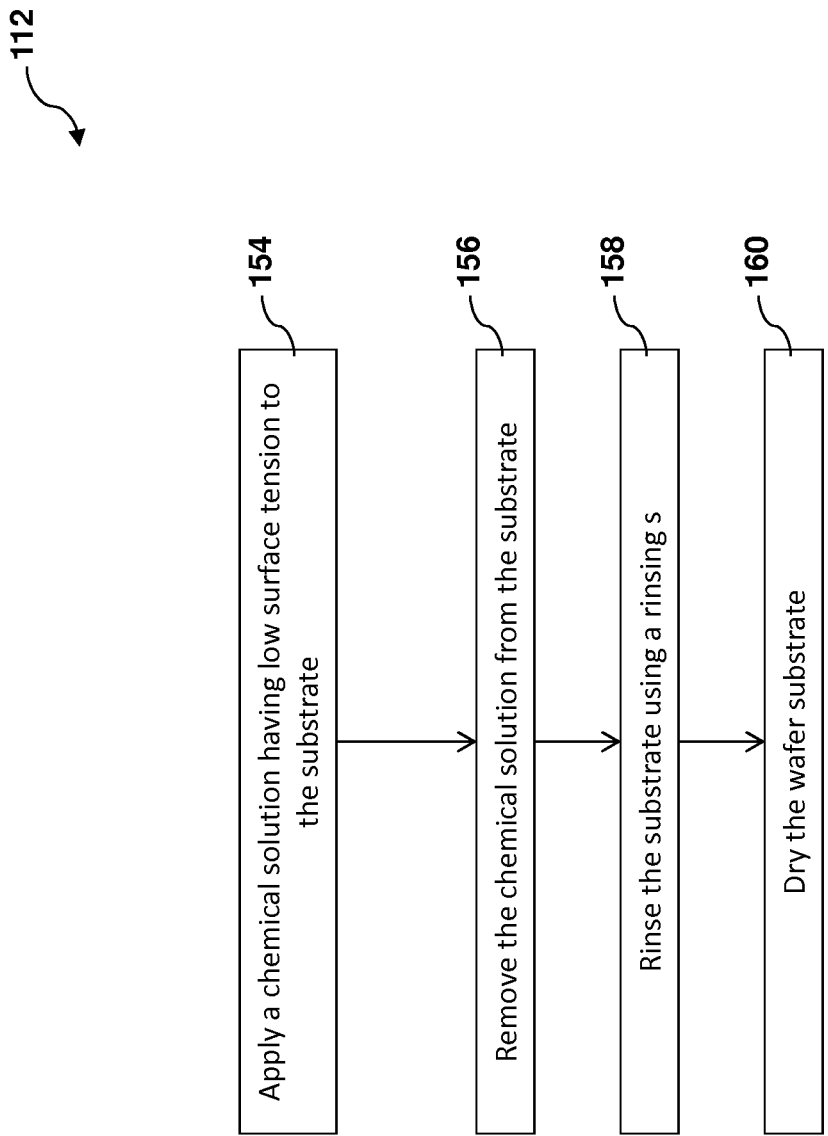
FIG. 6 is a flow chart of an example cleaning step from the method of FIG. 1.

The cleaning step 112 of FIG. 1 is described with further reference to FIG. 6. At step 154, a chemical solution having a low surface tension on the substrate is applied to clean the substrate, such as removing an unconsumed resist film and etching residues after an etching process. In the present embodiments, a chemical solution is also referred to as a cleaning solution. In some embodiments, removing an unconsumed resist film and etching residues includes dissolving the unconsumed resist film and etching residues into a chemical solution having a low surface tension to prevent a pattern formed on the substrate collapse or fall.

In some embodiments, a chemical solution having a low surface tension may include following components as shown in Table 1.

TABLE 1

| Component | % by weight |
| --- | --- |
| Organic solvent | 5~95 |
| Water | 0.01~95 |
| pH buffering agent | 0.01~50 |
| Hydrogen peroxide | 0~30 |
| Other additives (e.g. metal chelating agent or metal inhibitor) | 0~10 |

In other embodiments, a chemical solution having a low surface tension may include following components as shown in Table 2.

TABLE 2

| Component | % by weight |
| --- | --- |
| Surfactant | 0.01~2 |
| Water | 0.01~99.98 |
| pH buffering agent | 0.01~50 |
| Hydrogen peroxide | 0~30 |

TABLE 2-continued

| Component | % by weight |
|---|---|
| Other additives (e.g. metal chelating agent or metal inhibitor) | 0~10 |

In additional embodiments, a chemical solution having a low surface tension may include following components as shown in Table 3.

TABLE 3

| Component | % by weight |
|---|---|
| Organic solvent | 5~95 |
| Surfactant | 0.01~2 |
| Water | 0.01~99.98 |
| pH buffering agent | 0.01~50 |
| Hydrogen peroxide | 0~30 |
| Other additives (e.g. metal chelating agent or metal inhibitor) | 0~10 |

The organic solvent can include an alcohol, an alcohol ether or an ether acetate. In one embodiment, a ratio of carbon to oxygen in an organic solvent is no more than 5. Embodiments with alcohol may include a propanol, such as 1-propanol ($CH_3CH_2CH_2OH$), a butanol, such as 1-butanol ($CH_3CH_2CH_2CH_2OH$), 2-mehoxyethanol ($CH_3OC_2H_4OH$), 2-ethoxyethanol ($C_2H_5OC_2H_4OH$), 2-butoxyethanol ($C_4H_9OC_2H_4OH$), or n-hexyl glycol ($C_6H_{13}OC_2H_4OH$).

Alcohol ether embodiments may include propylene glycol monomethyl ether ($CH_3OC_3H_6OH$), propylene glycol monoethyl ether ($C_2H_4OC_3H_6OH$), propylene glycol monobutyl ether ($C_4H_9OC_3H_6OH$), propylene glycol monohexyl ether ($C_6H_{12}OC_3H_6OH$), diethylene glycol monomethyl ether ($CH_3OC_2H_4OC_2H_4OH$), diethylene glycol monoethyl ether ($C_2H_5OC_2H_4OC_2H_4OH$), diethylene glycol monobutyl ether ($C_4H_9OC_2H_4OC_2H_4OH$), dipropylene glycol monomethyl ether ($CH_3OC_3H_6OC_3H_6OH$), dipropylene glycol monoethyl ether ($C_2H_5OC_3H_6OC_3H_6OH$), or dipropylene glycol monobutyl ether ($C_4H_9OC_3H_6OC_3H_6OH$). In yet another embodiment, an ether acetate includes ethylene glycol monobutyl ether acetate ($C_4H_9OC_2H_4OCOCH_3$) or diethylene glycol monobutyl ether acetate ($C_4H_9OC_2H_4OC_2H_4OCOCH_3$).

In some embodiments, a surfactant is used to lower surface tension of a water based chemical solution. The surfactant may be a non-ionic surfactant, selected from the functional group of alkyl ethers and alkylphenol ethers containing glycoside, polyethylene glycol, polypropylene glycol, or combinations thereof. Example non-ionic surfactants include octyl glucoside ($C_6H_{11}O_6(CH_2)_7CH_3$), decyl glucoside ($C_6H_{11}O_6(CH_2)_9CH_3$), dodycyl glucoside ($C_6H_{11}O_6(CH_2)_{11}CH_3$), pentaethylene glycol monododecyl ether ($CH_3(CH_2)_{11}(OC_2H_4)_5OH$), octalethylene glycol monododecyl ether ($CH_3(CH_2)_{11}(OC_2H_4)_8OH$), octalpropylene glycol monododecyl ether ($CH_3(CH_2)_{11}(OC_3H_6)_8OH$), polyethylene glycol p-(1,1,3,3-tetramethylbutanol ($CH_{14}H_{22}(OC_2H_4)_{10}OH$), polyoxyethylene sorbitan monooleate ($C_{24}H_{43}O_5(OC_2H_4)_{20}OH$), polyoxyethylene octylphenyl ether ($C_8H_{17}C_6H_4(OC_2H_4)_{12}OH$), or polyoxyethylene nonylphenyl ether ($C_9H_{19}C_6H_4(OC_2H_4)_9OH$).

In some embodiments, a pH buffer agent includes an acid buffer agent controlling a pH value of a chemical solution ranging from about 1 to 9 and a base buffer agent controlling a pH value of a chemical solution ranging from about 6 to 11. In one embodiment, an acid buffer is used in a chemical solution for cleaning a substrate containing W or W alloy. In another embodiment, a base buffer agent is used in a chemical solution for cleaning a substrate containing Cu, Cu alloy or Co. Examples of buffer agents for different pH control include Tetramethylammonium hydroxide ($C_4H_{12}N$), Trimethylamine N-oxide ($C_3H_9NO$), Triethanolamine ($C_6H_{15}NO_3$), Triethylamine ($C_6H_{15}N$), N,N-dimethylacetamide ($C_4H_9NO$), N-Methyl-pyrrolidone ($C_5H_9NO$), N-Methylmorpholine ($C_5H_{11}NO$), N-Methylmorpholin oxide ($C_5H_{11}NO_2$), 4-Methoxypyridine-N-oxide ($C_6H_7NO_2*xH_2O$), pyridine-N-oxide ($C_5H_5NO$), and Furoxan ($C_2H_2N_2O_2$).

In some embodiments, other additives may include a metal chelating agent or a metal inhibitor. According to one or more embodiments, a metal chelating agent or a metal inhibitor can react with a metal, such as W, Cu or Co, to form a complex compound so that the metal is easily removed from a substrate. Examples of metal chelating agents or metal inhibitors include Oxalic acid ($C_2H_2O_4$), Malonic acid ($C_3H_4O_4$), Citric acid ($C_6H_8O_7$), Lactic acid ($C_3H_6O_3$), Ethylenediaminetetraacetic acid ($C_{10}H_{16}N_2O_8$), Ethylenebis (oxyethylenenitrool) tetraacetic acid ($C_{14}H_{24}N_2O_{10}$), Pentetic acid ($C_{14}H_{23}N_3O_{10}$), and Nitrilotriacetic acid ($C_6H_9NO_6$).

Continuing with the present embodiments, a surface tension of a chemical solution prepared by using a formulation as shown in Table 1, Table 2 or Table 3 is low. Therefore, the low surface tension increases a critical aspect ratio of a pattern and makes an actual aspect ratio of a pattern lower than the critical aspect ratio as shown in FIG. 8. Thus, the chemical solution having low surface tension prevents the pattern collapse or fall.

According to one or more embodiments, one way of applying the chemical solution to a substrate includes using a batch process, such as disposing the substrate into a chemical tank filled with the chemical solution. Another way of applying the chemical solution to a substrate includes using a single substrate process on a cleaning tool, such as a cleaning track. In one embodiment, the chemical solution is applied on surface of a substrate secured on a chuck of a cleaning track while spinning the substrate. In another embodiment, approximate 100 to 200 ml of the chemical solution is applied to surface of the substrate.

At step 156 the chemical solution is removed from the substrate. In the present embodiments, the unconsumed resist film and the etching residues dissolved into the chemical solution are also removed. One way of removing the chemical solution includes moving the substrate from the chemical solution tank to a rinse tank in a batch process. Another way of removing the chemical solution includes spinning the substrate secured on a chuck of a cleaning track to spin-off the chemical solution disposed on surface of the substrate.

At step 158, the substrate is rinsed using a rinsing agent. In some embodiments, the rinsing agent includes deionized (DI) water, isopropyl alcohol (IPA), or combination of both. One way of rinsing the substrate includes disposing the substrate into a rinsing tank filled with a rinsing agent. Another way of rinsing the substrate includes disposing a rinsing agent to surface of the substrate secured on a chuck of a cleaning track while spinning the substrate.

At step 160, the substrate is dried. One way of drying the substrate includes spinning the substrate secured in a boat in a spinning tool, such as a semi-tool. In one embodiment, drying the substrate in a semi-tool includes using a rinsing agent. Another way of drying the substrate includes spinning the substrate secured on a chuck of a cleaning tool.

Figure 7:
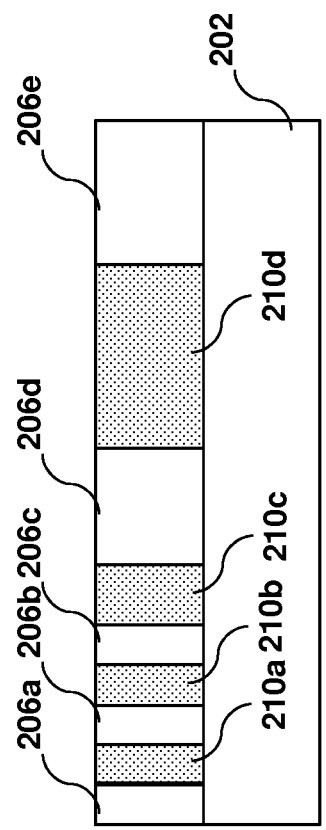

Referring again to FIG. 1, after the substrate has been cleaned at step 112, the method 100 proceeds to step 114 by filling a trench between the substrate patterns formed in the substrate. In one embodiment, filling a trench includes using a dielectric material, such as silicon oxide, silicon nitride, or silicon nitride, to form an isolation structure. In another embodiment, filling a trench includes using a metal, such as Cu, Cu alloy, W, W alloy or Co, to form a trench and via plug for connecting a metal layer underneath the trench. In an alternative embodiment, filling the trench includes growing a doped dielectric layer, such as SiGe, to form a source and drain for a vertical device, a fin field effect transistor (FinFET) device, or a gate all around (GAA) device. Referring to FIG. 7, trench layers 210a-d are formed between the substrate patterns 206a-e respectively in the substrate 202.

One of the broader forms of the present disclosure involves a chemical solution for use in cleaning a patterned substrate. The chemical solution includes water, from approximate 0.01 to 99.98 percent by weight; hydrogen peroxide, from 0 to 30 percent by weight; a pH buffering agent, from approximate 0.01 to 50 percent by weight; a metal chelating agent, from approximate 0 to 10 percent by weight; and a compound for lowering a surface tension of the combination of water, hydrogen peroxide, pH buffering agent, and metal chelating agent. Examples of the compound include an organic solvent, from approximate 0 to 95 percent by weight, or a non-ionic surfactant agent, from approximate 0 to 2 percent by weight.

Another of the broader forms of the present disclosure involves a chemical solution for use in cleaning a patterned substrate. The chemical solution includes at least one of either an organic solvent, from approximate 0 to 95 percent by weight, or a non-ionic surfactant agent, from approximate 0 to 2 percent by weight; water, from approximate 0.01 to 99.98 percent by weight; hydrogen peroxide, from 0 to 30 percent by weight; a pH buffering agent, from approximate 0.01 to 50 percent by weight; and a metal chelating agent, from approximate 0 to 10 percent by weight.

Still another of the broader forms of the present disclosure involves a method of fabricating a semiconductor device. The method comprises receiving a patterned substrate, cleaning the patterned substrate with a chemical solution, performing a rinse process; drying the substrate using a spin process; and filling a pattern in the patterned substrate with a material. The chemical solution includes: at least one of either an organic solvent, from approximate 0 to 95 percent by weight, or a non-ionic surfactant agent, from approximate 0 to 2 percent by weight; water, from approximate 0.01 to 99.98 percent by weight; hydrogen peroxide, from 0 to 30 percent by weight; a pH buffering agent, from approximate 0.01 to 50 percent by weight; and a metal chelating agent, from approximate 0 to 10 percent by weight.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chemical solution for use in cleaning a patterned substrate, the chemical solution comprising:
   water, from approximately 0.01 to 99.98 percent by weight;
   hydrogen peroxide, from 0 to 30 percent by weight;
   a pH buffering agent, from approximately 0.01 to 50 percent by weight;
   a metal chelating agent, from approximately 0 to 10 percent by weight;
   a compound for lowering a surface tension of the combination of water, hydrogen peroxide, pH buffering agent, and metal chelating agent,
   wherein the compound includes an ether acetate, and wherein the ether acetate includes ethylene glycol monobutyl ether acetate ($C_4H_9OC_2H_4OCOCH_3$) or diethylene glycol monobutyl ether acetate ($C_4H_9OC_2H_4OC_2H_4OCOCH_3$).

2. The chemical solution of claim 1, wherein the compound further includes an organic solvent, which is selected from the functional group of alcohol, and alcohol ether, wherein a ratio of carbon and oxygen in the organic solvent is no more than 5 (C/O<5).

3. The chemical solution of claim 1, wherein the compound further includes an organic solvent including an alcohol and wherein the alcohol includes at least one of a propanol, a butanol, 2-methoxyethanol ($CH_3OC_2H_4OH$), 2-ethoxyethanol ($C_2H_5OC_2H_4OH$), 2-butoxyethanol ($C_4H_9OC_2H_4OH$), or n-hexyl glycol ($CH_6H_{13}OC_2H_4OH$).

4. The chemical solution of claim 1, wherein the compound further includes an organic solvent, which is selected from the functional group consisting of propylene glycol monomethyl ether ($CH_3OC_3H_6OH$), propylene glycol monoethyl ether ($C_2H_5OC_3H_6OH$), propylene glycol monobutyl ether ($C_4H_9OC_3H_6OH$), propylene glycol monohexyl ether ($C_6H_{13}OC_3H_6OH$), diethylene glycol monomethyl ether ($CH_3OC_2H_4OC_2H_4OH$), diethylene glycol monoethyl ether ($C_2H_5OC_2H_4OC_2H_4OH$), diethylene glycol monobutyl ether ($C_4H_9OC_2H_4OC_2H_4OH$), dipropylene glycol monomethyl ether ($CH_3OC_3H_6OC_3H_6OH$), dipropylene glycol monoethyl ether ($C_2H_5OC_3H_6OC_3H_6OH$), or dipropylene glycol monobutyl ether ($C_4H_9OC_3H_6OC_3H_6OH$).

5. The chemical solution of claim 1, wherein the compound further includes a non-ionic surfactant selected from the functional group of alkyl ethers and alkylphenol ethers containing glycoside, polyethylene glycol, polypropylene glycol, or combinations thereof.

6. The chemical solution of claim 1, wherein the compound further includes a non-ionic surfactant selected from the functional group consisting of octyl glucoside ($C_6H_{11}O_6(CH_2)_7CH_3$), decyl glucoside ($C_6H_{11}O_6(CH_2)_9CH_3$), dodecyl glucoside ($C_6H_{11}O_6(CH_2)_{11}CH_3$), pentaethylene glycol monododecyl ether ($CH_3(CH_2)_{11}(OC_2H_4)_5OH$), octaethylene glycol monododecyl ether ($CH_3(CH_2)_{11}(OC_2H_4)_8OH$), octalpropylene glycol monododecyl ether ($CH_3(CH_2)_{11}(OC_3H_6)_8OH$), polyethylene glycol p-(1,1,3,3-tetramethylbutanol ($CH_{14}H_{22}(OC_2H_4)_{10}OH$), polyoxyethylene sorbitan monooleate ($C_{24}H_{43}O_5(OC_2H_4)_{20}OH$), polyoxyethylene octylphenyl ether ($C_8H_{17}C_6H_4(OC_2H_4)_{12}OH$), or polyoxyethylene nonylphenyl ether ($C_9H_{19}C_6H_4(OC_2H_4)_9OH$).

7. The chemical solution of claim 1, wherein the pH buffering agent includes a first buffer for controlling a pH value ranging from approximately 1 to 9.

8. The chemical solution of claim 7, wherein the pH buffering agent includes a second buffer for controlling a pH value ranging from approximately 6 to 11.

9. A chemical solution for use in cleaning a patterned substrate, the chemical solution comprising:
   an organic solvent, from approximately 0 to 95 percent by weight;
   a non-ionic surfactant agent, from approximately 0 to 2 percent by weight;

water, from approximately 0.01 to 99.98 percent by weight;

hydrogen peroxide, from 0 to 30 percent by weight;

a pH buffering agent, from approximately 0.01 to 50 percent by weight; and a metal chelating agent, from approximately 0 to 10 percent by weight, wherein the organic solvent includes an ether acetate, and wherein the ether acetate includes ethylene glycol monobutyl ether acetate ($C_4H_9OC_2H_4OCOCH_3$) or diethylene glycol monobutyl ether acetate ($C_4H_9OC_2H_4OC_2H_4OCOCH_3$).

10. The chemical solution of claim 9, wherein the organic solvent further includes an alcohol and wherein the alcohol includes at least one of a propanol, a butanol, 2-methoxyethanol ($CH_3OC_2H_4OH$), 2-ethoxyethanol ($C_2H_5OC_2H_4OH$), 2-butoxyethanol ($C_4H_9OC_2H_4OH$), or n-hexyl glycol ($CH_6H_{13}OC_2H_4OH$).

11. The chemical solution of claim 9, wherein the organic solvent includes a further solvent selected from the functional group consisting of propylene glycol monomethyl ether ($CH_3OC_3H_6OH$), propylene glycol monoethyl ether ($C_2H_5OC_3H_6OH$), propylene glycol monobutyl ether ($C_4H_9OC_3H_6OH$), propylene glycol monohexyl ether ($C_6H_{13}OC_3H_6OH$), diethylene glycol monomethyl ether ($CH_3OC_2H_4OC_2H_4OH$), diethylene glycol monoethyl ether ($C_2H_5OC_2H_4OC_2H_4OH$), diethylene glycol monobutyl ether ($C_4H_9OC_2H_4OC_2H_4OH$), dipropylene glycol monomethyl ether ($CH_3OC_3H_6OC_3H_6OH$), dipropylene glycol monoethyl ether ($C_2H_5OC_3H_6OC_3H_6OH$), or dipropylene glycol monobutyl ether ($C_4H_9OC_3H_6OC_3H_6OH$).

12. The chemical solution of claim 9, wherein the organic solvent includes a further solvent selected from the functional group of alcohol, and alcohol ether, wherein a ratio of carbon and oxygen in the organic solvent is no more than 5 (C/O <5).

13. The chemical solution of claim 9, wherein the non-ionic surfactant agent is selected from the functional group of alkyl ethers and alkylphenol ethers containing glycoside, polyethylene glycol, polypropylene glycol, or combinations thereof.

14. The chemical solution of claim 9, wherein the non-ionic surfactant agent is selected from the functional group consisting of octyl glucoside ($C_6H_{11}O_6(CH_2)_7CH_3$), decyl glucoside ($C_6H_{11}O_6(CH_2)_9CH_3$), dodecyl glucoside ($C_6H_{11}O_6(CH_2)_{11}CH_3$), pentaethylene glycol monododecyl ether ($CH_3(CH_2)_{11}(OC_2H_4)_5OH$), octaethylene glycol monododecyl ether ($CH_3(CH_2)_{11}(OC_2H_4)_8OH$), octalpropylene glycol monododecyl ether ($CH_3(CH_2)_{11}(OC_3H_6)_8OH$), polyethylene glycol p-0,1,3,3-tetramethylbutanol ($CH_{14}H_{22}(OC_2H_4)_{10}OH$), polyoxyethylene sorbitan monooleate ($C_{24}H_{43}O_5(OC_2H_4)_{20}OH$), polyoxyethylene octylphenyl ether ($C_8H_{17}C_6H_4(OC_2H_4)_{12}OH$), or polyoxyethylene nonylphenyl ether ($C_9H_{19}C_6H_4(OC_2H_4)_9OH$).

15. The chemical solution of claim 9, wherein the pH buffering agent includes a first buffer for controlling a pH value ranging from approximately 1 to 9.

16. The chemical solution of claim 15, wherein the pH buffering agent includes a second buffer for controlling a pH value ranging from approximately 6 to 11.

* * * * *